(12) United States Patent
Kim et al.

(10) Patent No.: US 10,892,309 B2
(45) Date of Patent: Jan. 12, 2021

(54) DISPLAY APPARATUS INCLUDING A PLURALITY OF BANKS AND A METHOD OF MANUFACTURING THE SAME

(71) Applicant: SAMSUNG DISPLAY CO., LTD., Yongin-si (KR)

(72) Inventors: Taehoon Kim, Yongin-si (KR); Minjae Kim, Yongin-si (KR); Minhee Kim, Yongin-si (KR); Kyunghae Park, Yongin-si (KR); Keunwoo Park, Yongin-si (KR); Joonhyung Park, Yongin-si (KR); Danbi Yang, Yongin-si (KR); Hanjun Yu, Yongin-si (KR); Dokyung Youn, Yongin-si (KR); Changhun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/793,842

(22) Filed: Feb. 18, 2020

(65) Prior Publication Data

US 2020/0335562 A1 Oct. 22, 2020

(30) Foreign Application Priority Data

Apr. 17, 2019 (KR) .......................... 10-2019-0045136

(51) Int. Cl.
*H01L 27/32* (2006.01)
*H01L 51/50* (2006.01)
(Continued)

(52) U.S. Cl.
CPC ........ *H01L 27/3246* (2013.01); *H01L 27/322* (2013.01); *H01L 51/502* (2013.01); *H01L 51/5259* (2013.01); *H01L 51/56* (2013.01)

(58) Field of Classification Search
None
See application file for complete search history.

(56) References Cited

U.S. PATENT DOCUMENTS 7,259,110 B2 8/2007 Ohnuma et al.
7,820,340 B2 10/2010 Lee et al.
(Continued)

FOREIGN PATENT DOCUMENTS

JP 2005-340802 12/2005
KR 10-0645534 11/2006
(Continued)

*Primary Examiner* — J. E. Schoenholtz
(74) *Attorney, Agent, or Firm* — F. Chau & Associates, LLC

(57) ABSTRACT

A display apparatus is provided including a first substrate on which a plurality of organic light-emitting diodes are arranged. A second substrate is bonded to the first substrate. The second substrate includes a plurality of light control units respectively corresponding to the plurality of organic light-emitting diodes and a plurality of banks arranged between the plurality of light control units. The plurality of banks include a first bank having a deflection arrangement structure in which a fluorine-containing polymer is concentrated on a surface of a side of the first bank, and a second bank that does not have a deflection arrangement structure in which the fluorine-containing polymer is deflectively arranged.

20 Claims, 11 Drawing Sheets

(51) Int. Cl.
*H01L 51/52* (2006.01)
*H01L 51/56* (2006.01)

(56) References Cited

U.S. PATENT DOCUMENTS

| | | |
|---|---|---|
| 8,661,973 B2 | 3/2014 | Nakashima et al. |
| 9,684,160 B2 | 6/2017 | Kodaira |
| 2018/0190736 A1* | 7/2018 | Kim .................... H01L 27/3213 |
| 2019/0189713 A1* | 6/2019 | Kondo ................ H01L 51/5056 |

FOREIGN PATENT DOCUMENTS

| KR | 10-1199749 | 11/2012 |
| KR | 1020130091933 | 8/2013 |

* cited by examiner

DISPLAY APPARATUS INCLUDING A PLURALITY OF BANKS AND A METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2019-0045136, filed on Apr. 17, 2019, in the Korean Intellectual Property Office, the disclosure of which is incorporated by reference herein in its entirety.

1. Technical Field

Exemplary embodiments of the present invention relate to a display apparatus and more particularly, to a display apparatus including a plurality of banks and a method of manufacturing the same.

2. Discussion of Related Art

A display apparatus such as an organic light-emitting display apparatus transmits an image by generating light based on a principle in which a hole and an electron injected from an anode and a cathode, respectively, recombine with each other in a light-emitting layer to thereby produce excitons and emit light. For example, the display apparatus includes pixels emitting light of a color among red, green, and blue, and combines colors of the pixels with each other to thereby produce a desired color of light.

Each of the pixels includes an organic light-emitting diode configured to generate monochromatic light such as white light or blue light, and a quantum-dot thin-film layer, a color filter layer, etc. Light control units are provided which convert the monochromatic light into light of a desired color among red, green and blue, and emit the converted light. For example, when the organic light-emitting diode of each of the pixels generates monochromatic light, the monochromatic light passes through the quantum-dot thin-film layer and the color filter. The monochromatic light is converted into light of a color among red, green, and blue to be emitted. Thus, an image with a desired color may be transmitted by combining proper colors of the emitted light of each of the pixels.

SUMMARY

A bank defining a boundary between pixels is arranged between the light control units. A phenomenon in which the bank is damaged frequently occurs, and thus, the boundary between the pixels disappears. Since the light control units are therefore arranged without a boundary therebetween, the light control units may not be accurately arranged. Thus, there is a high possibility that a defect of a color mixture between adjacent pixels may result.

According to an exemplary embodiment of the present invention, a display apparatus is provided including a first substrate on which a plurality of organic light-emitting diodes are arranged. A second substrate is bonded to the first substrate. The second substrate includes a plurality of light control units respectively corresponding to the plurality of organic light-emitting diodes and a plurality of banks arranged between the plurality of light control units. The plurality of banks include a first bank having a deflection arrangement structure in which a fluorine-containing polymer is concentrated on a surface of a side of the first bank, and a second bank that does not have a deflection arrangement structure in which the fluorine-containing polymer is deflectively arranged.

According to an exemplary embodiment of the present invention, the fluorine-containing polymer in the first bank is deflectively arranged on the surface the first bank which is opposite to the second substrate.

According to an exemplary embodiment of the present invention the fluorine-containing polymer comprises perfluoropolyether (PFPE).

According to an exemplary embodiment of the present invention, the surface on which the fluorine-containing polymer is deflectively arranged is liquid-repellent.

According to an exemplary embodiment of the present invention, the second bank is provided comprised of perfluoropolyether (PFPE), acryl, silicon, and/or epoxy.

According to an exemplary embodiment of the present invention, a coating layer is provided on a surface of the second bank corresponding to the surface of the first bank.

According to an exemplary embodiment of the present invention, the coating layer comprises a liquid-repellent material.

According to an exemplary embodiment of the present invention, a thin-film encapsulation layer is provided covering the plurality of organic light-emitting diodes.

According to an exemplary embodiment of the present invention, the plurality of organic light-emitting diodes all generate blue light.

According to an exemplary embodiment of the present invention, the plurality of light control units comprise a quantum-dot thin-film layer configured to change a color of light generated from the plurality of organic light-emitting diodes and/or a color filter layer configured to increase color purity of the light.

According to an exemplary embodiment of the present invention, a method of manufacturing an organic light-emitting display apparatus is provided in which a plurality of organic light-emitting diodes are formed on a first substrate. A plurality of color filter layers are respectively formed corresponding to the plurality of organic light-emitting diodes on a second substrate. A plurality of first banks are formed at positions between the plurality of color filter layers on the second substrate. Damaged first banks are repaired by forming second banks at positions where the first banks are damaged. A quantum-dot thin-film layer is formed on the plurality of color filter layers, and the first substrate is bonded to the second substrate.

According to an exemplary embodiment of the present invention, the plurality of first banks are formed by coating the second substrate with a composite polymer, wherein the composite polymer includes a fluorine-containing polymer and a non-fluorine-containing polymer. The fluorine-containing polymer on surfaces of the plurality of first banks are formed by heating the composite polymer, and leaving the composite polymer at the positions between the plurality of color filter layers by patterning the composite polymer.

According to an exemplary embodiment of the present invention, the fluorine-containing polymer comprises perfluoropolyether (PFPE).

According to an exemplary embodiment of the present invention, a liquid-repellent coating layer is formed on a surface of the second bank corresponding to the surfaces of the plurality of first banks.

According to an exemplary embodiment of the present invention, the forming of the second bank includes arranging a mask, in which an opening is formed, on the second substrate, and injecting a material of the second bank in the opening.

According to an exemplary embodiment of the present invention, the injecting of the material of the second bank includes melting the material of the second bank into the opening by irradiating the material of the second bank with a laser beam, or extruding the material of the second bank into the opening by pressing the material of the second bank.

According to an exemplary embodiment of the present invention, the material of the second bank comprises perfluoropolyether (PFPE), acryl, silicon and/or epoxy.

According to an exemplary embodiment of the present invention, the plurality of organic-light emitting diodes generate blue light, and the quantum-dot thin-film layer is formed at a position where the color of the blue light is to be changed.

According to an exemplary embodiment of the present invention, the quantum-dot thin-film layer changes a color of the light generated by an organic light-emitting diode of the plurality of organic light-emitting diodes, and the plurality of color filter layers increase color purity of the light.

According to an exemplary embodiment of the present invention, a thin-film encapsulation layer is provided covering the plurality of organic light-emitting diodes.

BRIEF DESCRIPTION OF THE FIGURES

The above and other features and aspects of the present invention will become more apparent from the following detailed description of exemplary embodiments taken in conjunction with the accompanying drawings, in which.

DETAILED DESCRIPTION OF THE EMBODIMENTS

Figure 1:
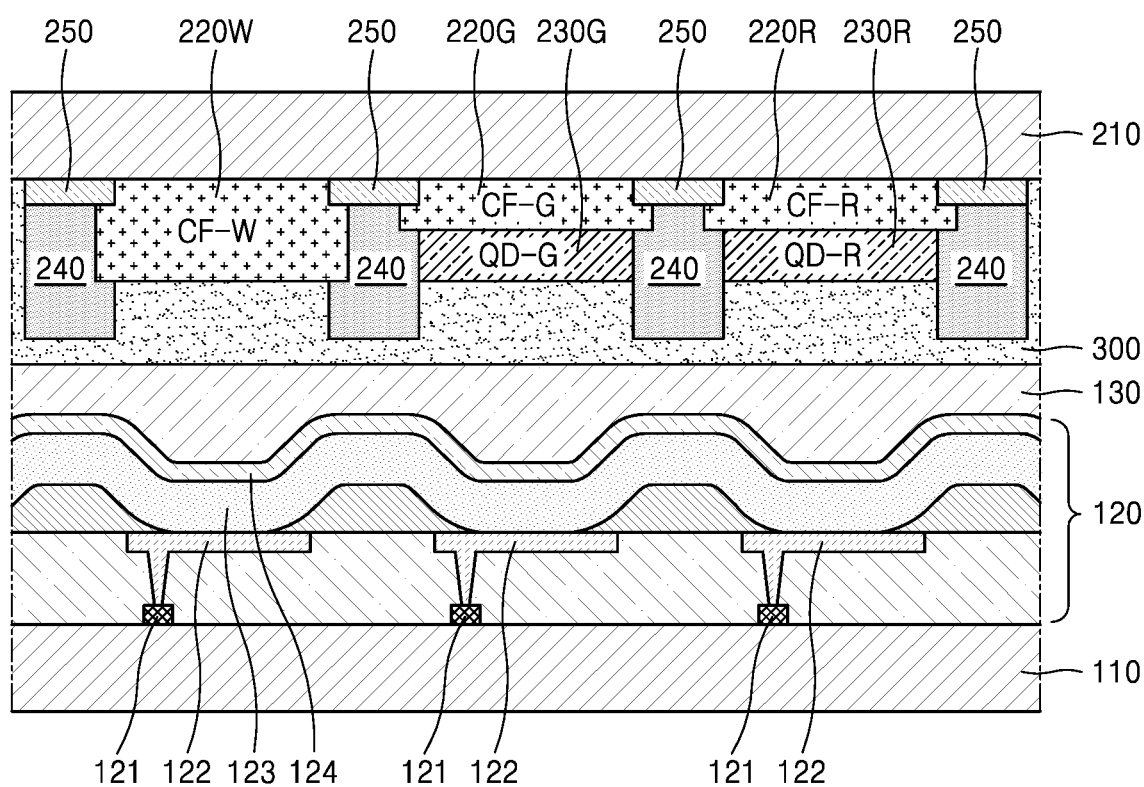
FIG. 1 is a cross-sectional view illustrating a display apparatus according to an exemplary embodiment of the present invention.

Reference will now be made in detail to exemplary embodiments of the present invention, examples of which are illustrated in the accompanying drawings. Like reference numerals may refer to like elements throughout the following detailed description. Although exemplary embodiments are described hereafter, the present invention may have various different forms and should not be construed as being limited to the descriptions and illustrations of the exemplary embodiments as set forth herein.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings may be illustrated for convenience of explanation, the present invention may be embodied differently from the exemplary embodiments illustrated in the figures.

A specific process order may be performed in a different sequence from the described order. For example, two consecutively described processes may be performed substantially at the same time or performed in an order opposite to the described order.

It will be understood that when a layer, region, or component is referred to as being "connected to" or "coupled to" another layer, region, or component, it may be "directly connected or coupled" to the other layer, region, or component, or "indirectly connected to" the other layer, region, or component with intervening elements therebetween. For example, when a layer, region, or component is referred to as being electrically "connected to" or "coupled to" another layer, region, or component, it may be electrically "directly connected or coupled" to the other layer, region, or component, or electrically "indirectly connected to" the other layer, region, or component with intervening elements therebetween.

FIG. 1 is a cross-sectional view of a display apparatus according to an exemplary embodiment of the present invention. Here, a set of pixels of three colors including red, green, and blue pixels are shown. However, the present invention is not limited thereto, and the colors and quantity of pixels belonging to each set of pixels may be variously changed.

As shown in FIG. 1, the display apparatus according to an exemplary embodiment of the present invention has a structure in which a first substrate 110 is bonded to a second substrate 210 with a filler 300 therebetween. An organic light-emitting diode 120 is arranged on the first substrate 110, and light control units including quantum-dot thin-film layers 230R and 230G and color filter layers 220R, 220G, and 220W are arranged on the second substrate 210.

The organic light-emitting diode 120 has a structure in which an organic light-emitting layer 123 is arranged between an anode electrode 122 and a cathode electrode 124. The organic light-emitting diode 120 generates light according to a principle in which a hole and an electron injected from the two electrodes including the anode electrode 122 and the cathode electrode 124, respectively, recombine with each other in the organic light-emitting layer 123 to thereby produce excitons that emit light. The organic light-emitting diode 120 generates blue light, and the light control units of each of the red, green, and blue pixels convert the blue light into red, green, and blue light, respectively.

A pixel circuit 121 is connected to the anode electrode 122. The pixel circuit 121 includes elements such as a thin-film transistor and a capacitor. A thin-film encapsulation layer 130 is provided covering the organic light-emitting diode 120 and may protect the organic light-emitting diode 120. The thin-film encapsulation layer 130 may be a single layer including an organic layer or an inorganic layer or may include multiple layers in which an organic layer and an inorganic layer are stacked alternately. The inorganic layer may include silicon oxide, silicon nitride, and/or silicon oxynitride. The organic layer may include polyethylene terephthalate, polyethylene naphthalate, polycarbonate, polyimide, polyethylene sulfonate, polyoxymethylene, polyarylate, hexamethyldisiloxane, and/or an acrylic-based resin (e.g., polymethyl methacrylate, polyacrylic acid, etc.).

The light control units include the quantum-dot thin-film layers 230R and 230G and the color filter layers 220R, 220G, and 220W. The quantum-dot thin-film layers 230R and 230G convert blue light generated from the organic light-emitting diode 120 into light of a desired color such as red or green. The color filter layers 220R, 220G, and 220W may filter stray light that may be partially mixed from a conversion result, for example, a color such as red or green, to thereby increase a color purity. Here, while the red pixel and the green pixel each include both the quantum-dot thin-film layers 230R and 230G and the color filter layers 220R and 220G, respectively, the blue pixel includes only the color filter layer 220W of a white color. This is because blue light is generated from the organic light-emitting diode 120. For example, since the blue pixel does not need to change a color of light and only needs to transmit the light, the blue pixel includes only the white color filter layer 220W for filtering stray light.

A black matrix 250 is arranged between respective pixels. A bank 240 defines a boundary between light control units of respective pixels. For example, the bank 240 may be disposed between adjacent color filter layers 220W, 220G and 220R and adjacent quantum-dot thin-film layers 230R and 230G.

A surface of a least one of the banks 240 facing the first substrate 110 has a liquid-repellent characteristic. Such a liquid-repellent characteristic prevents a liquid droplet, sprayed from an ink jet, from staining the bank 240 when the quantum-dot thin-film layers 230R and 230G are formed by using an ink-jet method in a manufacturing process.

According to an exemplary embodiment of the present invention, the banks 240 may have an upper surface that is sloped. For example, the banks 240 may have a pyramidal or conical upper surface to help preserve ink and prevent contamination of adjacent pixels during ink-jet manufacturing.

According to an exemplary embodiment of the present invention, the slopes of the banks 240 may extend upward and opposite to one another away from the second substrate 210, thus ink run off may be contained in a valley formed between the upward extending slopes.

The at least one bank 240 has a deflection arrangement structure in which a fluorine-containing polymer in the bank 240 is concentrated on a surface of the at least one bank 240. For example, the fluorine-containing polymer on the at least one bank 240 may be disposed on an upper surface of the at least one bank 240. However, at least one of the banks 240 might not have such a deflection arrangement structure. The at least one bank 240 that does not have the deflection arrangement structure may be a repair bank generated by forming the bank 240a (See, e.g., FIGS. 2A and 2B) at a position where a bank 240 has been damaged.

Figure 2A:
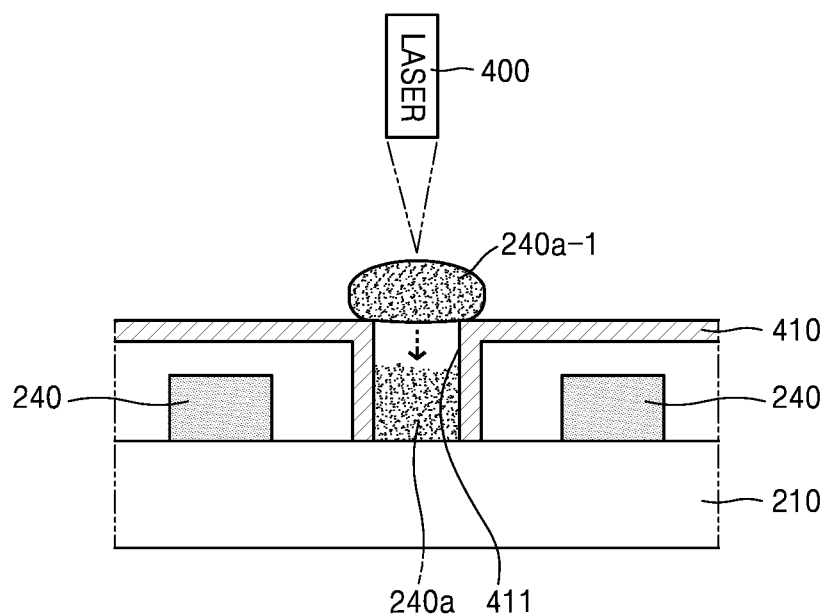
FIGS. 2A and 2B are cross-sectional views illustrating a repair process when a bank included in the display apparatus of FIG. 1 is damaged.
Figure 2B:
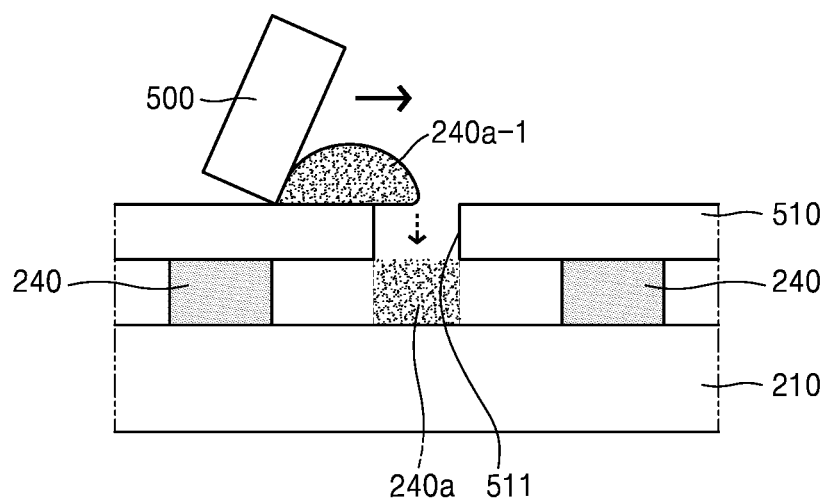

Hereinafter, banks having a deflection arrangement structure may also be referred to as first banks, and the repair banks may also be referred to as second banks. FIGS. 2A and 2B illustrate a repair process of forming second banks 240a in a position where a first bank 240 has been damaged. For example, as shown in FIG. 2A, a mask 410 is arranged on the second substrate 210 to match an opening 411 with a position in which the repairing is to be performed. Then, a material 240a-1 of the second bank 240a is placed on the opening 411 and a beam of a laser 400 is emitted toward the material 240a-1 so that the material 240a-1 is melted into the opening 411. Thus, the second bank 240a may be formed.

Alternatively, as shown in FIG. 2B, a mask 510 is arranged on the second substrate 210 and may expose an opening 511 in a position corresponding to a position in which repairing is to be performed. Then, a material 240a-1 of the second bank 240a is placed on the opening 511 and pressed by a presser 500. Accordingly, the material 240a-1 is pushed into the opening 511 and extruded to thereby form the second bank 240a.

Then, the second bank 240a is formed by performing a repair at a position where the first bank 240 is damaged. Accordingly, a boundary between pixels might not collapse, and thus, color mixture may be effectively prevented. A detailed process of manufacturing the first and second banks 240 and 240a will be described later on herein.

Then, a filler 300 is disposed on the first substrate 110 or the second substrate 210 and covers the first and second banks 240 and 240a. For example, the filler 300 may be arranged between the first substrate 110 and the second substrate 210, wherein the filler 300 may function as both a gap spacer maintaining a proper space between the first and second substrates 110 and 210 and a bonding material. Accordingly, when the filler 300 is applied to bond the first substrate 110 and the second substrate 210, the filler 300 properly maintains a gap between the first and second substrates 110 and 210 and firmly couples the first substrate 110 to the second substrate 210.

A display apparatus having the above-described structure may be manufactured by using a process shown in FIGS. 3A to 3G.

Figure 3A:
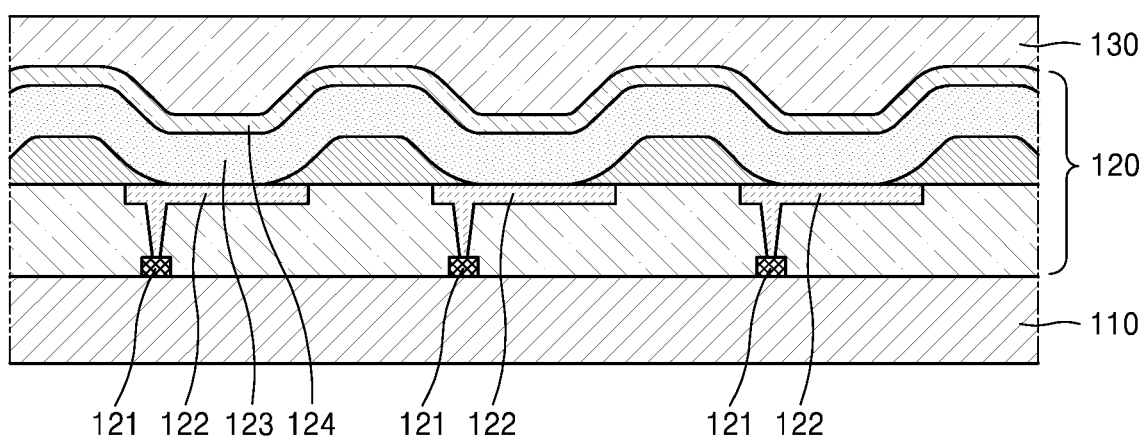
FIGS. 3A to 3G are cross-sectional views sequentially illustrating a process of manufacturing the display apparatus of FIG. 1.

First, shown in FIG. 3A, the organic light-emitting diode 120 is formed on the first substrate 110, and then, a thin-film encapsulation layer 130 is formed covering the organic light-emitting diode 120.

Figure 3B:
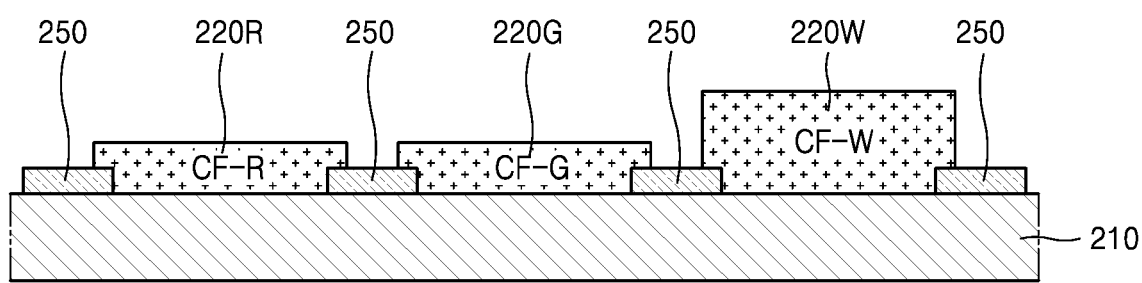

Next, as shown in FIG. 3B, the black matrix 250 and the color filter layers 220R, 220G, and 220W are formed on the second substrate 210 by using a photolithography process. The color filter layers 220R, 220G, and 220W are each formed in a position corresponding to an organic light-emitting diode 120.

Figure 3C:
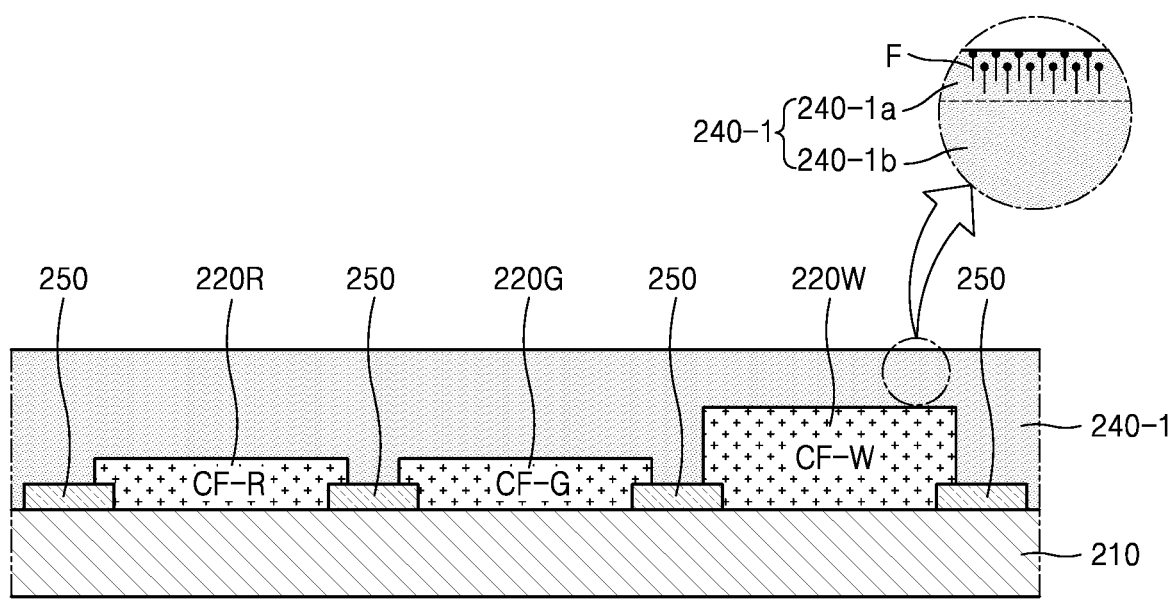

Then, as shown in FIG. 3C, the composite polymer 240-1 in which the fluorine-containing polymer 240-1a containing fluorine (F) is mixed with the non-fluorine-containing polymer 240-1b that does not contain fluorine is prepared and coated on the color filter layers 220R, 220G, and 220W and the black matrix 250, and then heated. For example, a composite polymer 240-1, in which a fluorine-containing polymer 240-1a such as perfluoropolyether (PFPE) is mixed with a non-fluorine-containing polymer 240-1b such as acryl, silicon, and/or epoxy, is coated on upper portions of the color filter layers 220R, 220G, and 220W and the black matrix 250 and then heated. The composite polymer 240-1 is a material that becomes the first bank 240 later on after further processing. When the composite polymer 240-1 is heated, the fluorine-containing polymer 240-1a in the composite polymer 240-1 is moved toward a surface of a side of the composite polymer 240-1, and thus, is deflectively arranged.

Deflectively arranged may mean that the fluorine-containing polymer 240-1a is concentrated on one surface resulting in a non-uniform distribution, as in the first bank 240. Otherwise, it may be a homogenous distribution of the fluorine-containing polymer as a whole, as in the second bank 240a. Also, the repaired second banks 240a may have a different material than the first banks 240. After heating, the fluorine containing polymer 240-1a may form an outer surface of the composite polymer 240-1 disposed opposite to the second substrate 210 and may have a polymer structure in which fluorine containing monomers are arranged in a staggered configuration.

Accordingly, the surface of the composite polymer 240-1 on which the fluorine-containing polymer 240-1a is concentrated has liquid-repellent characteristics.

Figure 3D:
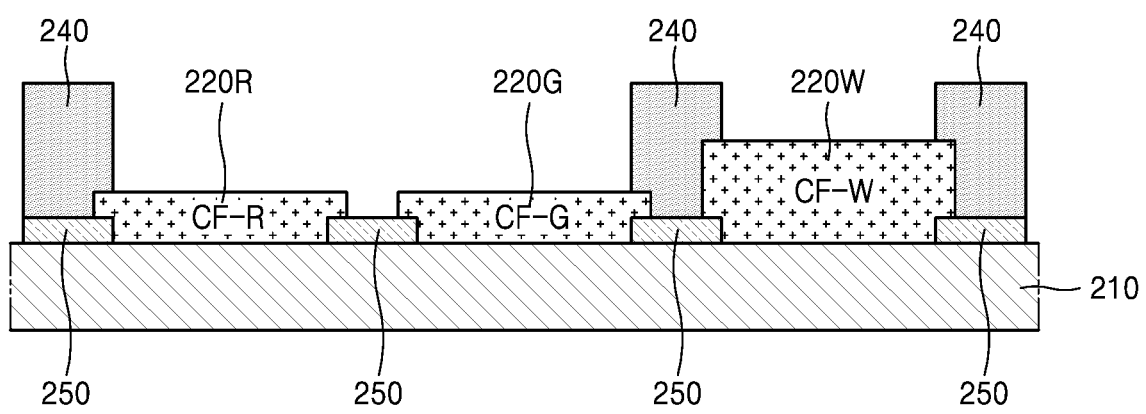

In addition, as shown in FIG. 3D, the composite polymer 240-1 is patterned to remain in each position between the color filter layers 220R, 220G, and 220W of each pixel. For example, the composite polymer 240-1 may be etched to produce the first banks 240. The first banks 240 are arranged as a boundary between respective pixels. A phenomenon in which first banks 240 in some positions between the respective pixels are damaged may occur after the coating, the heating, and/or the patterning are performed. This may be detected by a process of inspection through use of a camera after the first bank 240 is patterned. FIG. 3D illustrates an example in which the first bank 240 between the color filter layers 220R and 220G is damaged.

Figure 3E:
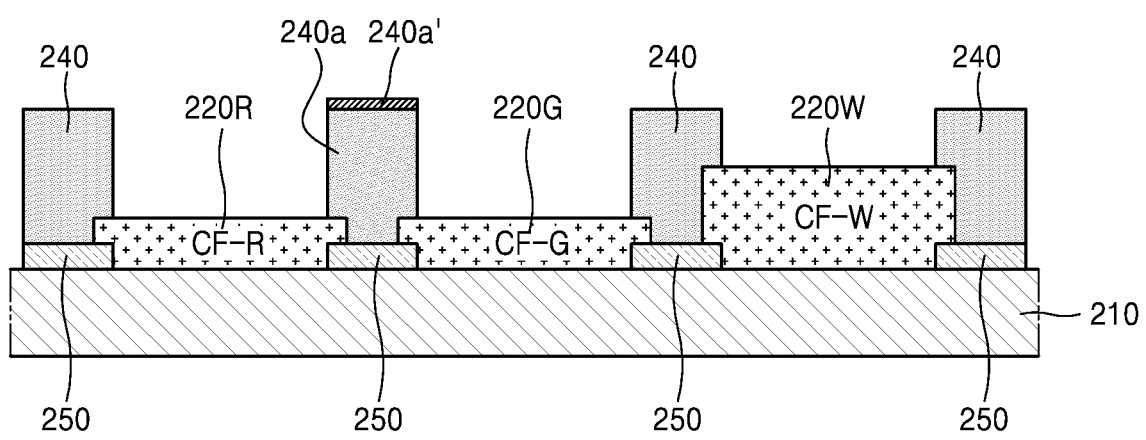

When the damage of the first bank 240 is detected, a repair operation is performed at a position of the damaged first bank 240 by forming the second bank 240a, as shown in FIG. 3E. A method of performing the repairing is described with reference to FIGS. 2A and 2B. That is, the mask 410 or 510 is placed on the second substrate 210 to match the opening 411 or 511 at a position of the damage. Then, the material 240a-1 is injected via the opening 411 or 511 by using the laser 400 or the presser 500 to thereby form the second bank 240a. The material 240a-1 of the second bank 240a may include a same composite polymer as that of the first bank 240; PFPE having liquid-repellent characteristics and acryl, silicon, and/or epoxy having non-liquid-repellent characteristics. The second bank 240a is generated as a repair bank through melting or extrusion in positions where the first bank 240 is damaged. Unlike the first bank 240, a heat treatment process of deflectively arranging a fluorine-containing polymer is not separately performed. Accordingly, a fluorine-containing polymer does not always need to be used. Also, the second bank 240a does not need to be a liquid-repellent material. Since a probability of the damage of the first bank 240 occurring is generally 1/10,000, whether the second bank 240a is liquid-repellent or non-liquid-repellent may have a low impact on the quality of a display apparatus. However, when a surface of the second bank 240a has liquid-repellent characteristics, a more stable quality of the product may be ensured. To do so, as shown in FIG. 3E, forming a liquid-repellent coating layer 240a' including a PFPE material on a surface of the second bank 240a may be further included. A stable bank structure is thereby obtained.

Figure 3F:
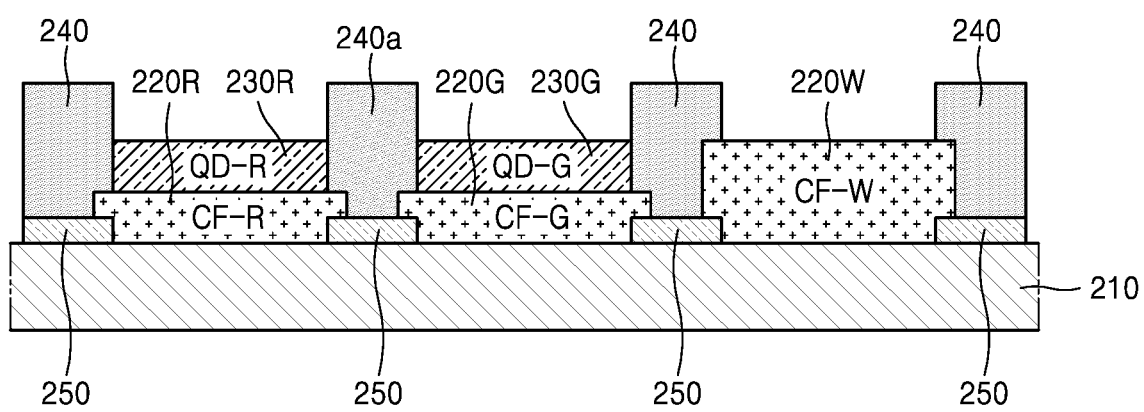

Then, as shown in FIG. 3F, quantum-dot thin-film layers 230R and 230G are formed selectively on a red pixel and a green pixel, but might not be formed on a blue pixel. In this case, the quantum-dot thin-film layers 230R and 230G are formed in positions overlapping the color filter layers 220R and 220G, respectively. The quantum-dot thin-film layers 230R and 230G may be formed by using an ink-jet process. Since a boundary between pixels is clearly defined by the first and second banks 240 and 240a, there is no possibility that color mixture may occur during the ink-jet process.

A quantum dot or a core that is a light color-change particle included in the quantum-dot thin-film layers 230R and 230G may include a Group II-VI compound, a Group III-V compound, a Group IV-VI compound, a Group IV element and/or a Group IV compound.

The Group II-VI compound may include a binary compound such as cadmium selenide (CdSe), cadmium telluride (CdTe), zinc sulfide (ZnS), zinc selenide (ZnSe), zinc telluride (ZnTe), zinc oxide (ZnO), mercury sulfide (HgS), mercury selenide (HgSe), mercury telluride (HgTe), magnesium selenide (MgSe) and/or magnesium sulfide (MgS); a ternary compound such as silver-indium-sulfide (AgInS), copper-indium-sulfur (CuInS), cadmium selenide sulphide (CdSeS), cadmium selenotelluride (CdSeTe), cadmium sulfur telluride (CdSTe), zinc selenium sulfide (ZnSeS), zinc selenide telluride (ZnSeTe), zinc sulfide telluride (ZnSTe), mercury selenium sulfide (HgSeS), mercury selenium telluride (HgSeTe), mercury sulfide telluride (HgSTe), cadmium zinc sulfide (CdZnS), cadmium zinc selenide (CdZnSe), cadmium zinc telluride (CdZnTe), cadmium mercury sulfide (CdHgS), cadmium mercury selenide (CdHgSe), cadmium mercury telluride (CdHgTe), mercury zinc sulfide (HgZnS), mercury zinc selenide (HgZnSe), mercury zinc telluride (HgZnTe), magnesium zinc selenide (MgZnSe) and/or magnesium zinc sulfide (MgZnS); and/or a quaternary compound such as zinc telluride sulfide (HgZnTeS), cadmium zinc selenide sulfide (CdZnSeS), cadmium zinc selenium telluride (CdZnSeTe), cadmium zinc sulfide telluride (CdZnSTe), cadmium mercury selenium sulfide (CdHgSeS), cadmium mercury selenium telluride (CdHgSeTe), cadmium mercury sulfide telluride (CdHgSTe), mercury zinc selenium sulfide (HgZnSeS), mercury zinc selenium telluride (HgZnSeTe) and/or mercury zinc sulfide telluride (HgZnSTe).

The Group III-V compound may be selected from a binary compound such as gallium nitride (GaN), gallium phosphide (GaP), gallium arsenide (GaAs), gallium antimonide (GaSb), aluminum nitride (AlN), aluminum phosphide (AlP), aluminum arsenide (AlAs), aluminum antimonide (AlSb), indium nitride (InN), indium phosphide (InP), indium arsenide (InAs) and/or indium antimonide (InSb); and/or a ternary compound such as gallium-nanoparticles (GaNP), aluminum-nitride-arsenic (GaNAs), gallium nitride antimonide (GaNSb), gallium phosphide arsenide (GaPAs), gallium phosphide antimonide (GaPSb), alumina nanoparticles (AlNP), aluminum-nitride-arsenic (AlNAs), AlNSb, aluminum phosphide arsenide (AlPAs), aluminum phosphide antimonide (AlPSb), indium gallium phosphide (InGaP), indium nanoparticle (InNP), InNAs, InNSb, indium phosphide arsenide (InPAs), indium phosphide antimonide (InPSb) and/or gallium alumina nanoparticles (GaAlNP); and/or a quaternary element selected from a group consisting of GaAlNAs, GaAlNSb, gallium aluminum phosphide arsenide (GaAlPAs), gallium aluminum phosphide antimonide (GaAlPSb), GaInNP, GaInNAs, GaInNSb, gallium indium phosphide arsenide (GaInPAs), gallium indium phosphide antimonide (GaInPSb), InAlNP, InAlNAs, InANSb, indium aluminum phosphide arsenide (InAlPAs) and/or indium aluminum phosphide antimonide (InAlPSb).

The Group IV-VI compound include a binary compound selected from a group consisting of tin sulfide (SnS), tin selenide (SnSe), tin telluride (SnTe), lead(II) sulfide, lead Selenide (PbSe) and/or lead telluiide (PbTe); and/or a ternary compound selected from a group consisting of tin selenium sulfide (SnSeS), tin selenium telluride (SnSeTe), tin sulphotelluride (SnSTe), lead selenium sulfide (PbSeS), lead selenium telluride (PbSeTe), lead sulfide telluride (PbSTe), tin lead sulfide (SnPbS), tin lead selenide (SnPbSe) and/or tin lead telluride (SnPbTe); and/or a quaternary compound selected from tin lead sulfide selenide (SnPbSSe), tin lead selenium telluride (SnPbSeTe) and/or tin lead sulfide telluride (SnPbSTe). The Group IV element include silicon (Si) and/or germanium (Ge). The Group IV compound is a silicon carbide (SiC) and/or silicon-germanium (SiGe).

In this case, the binary compound, the ternary compound, and/or the quaternary compound may be present in a particle at a uniform concentration, or may be in a same particle but in different states with partially different concentration distributions. In addition, the binary compound, the ternary compound, and/or the quaternary compound may have a core/shell structure in which a quantum dot surrounds another quantum dot. An interface between the core and the shell may include a concentration gradient in which a concentration of an element present in the shell is increasingly reduced toward a center of the core.

According to an exemplary embodiment of the present invention a quantum dot may have a core-shell structure that includes a core including a nanocrystal described above and a shell surrounding the core. A shell of the quantum dot may function as a protective layer configured to maintain semiconductor characteristics by preventing chemical modification of the core and/or as a charging layer configured to provide electrophoresis characteristics to the quantum dot. The shell may include a single layer or multiple layers. An interface between the core and the shell may include a concentration gradient in which a concentration of an element present in the shell is increasingly reduced toward a center of the core. Examples of the shell of the quantum dot may include an oxide of a metal or a non-metal, and/or semiconductor compound.

For example, the oxide of a metal or a non-metal may include a binary compound such as silicon oxide ($SiO_2$), aluminum oxide ($AlO_3$), titanium dioxide ($TiO_2$), zinc oxide (ZnO), manganese(II) oxide (MnO), manganese(III) oxide ($Mn_2O_3$), manganese(II,III) oxide ($MnO_4$), cupric oxide (CuO), iron(II) oxide (FeO), iron(II) oxide ($Fe_2O_3$), iron(II, II) oxide ($Fe_2O_4$), cobalt(II) oxide (CoO), cobalt (II,III) oxide ($Co_2O_4$) and/or nickel oxide (NiO) and/or a tertiary compound such as magnesium aluminate ($MgAl_2O_4$), cobalt iron oxide ($CoFe_2O_4$), nickel(II) iron(III) oxide ($NiFe_2O_4$) and/or cobalt-manganese oxide ($CoMn_2O_4$). However, the present invention is not limited thereto.

In addition, the semiconductor compound may include cadmium sulfide (CdS), CdSe, CdTe, ZnS, ZnSe, ZnTe, ZnSeS, zinc telluride sulfide (ZnTeS), GaAs, GaP, GaSb, mercury(II) sulfide (HgS), HgSe, HgTe, InAs, InP, InGaP, InSb, AlAs, AlP and/or AlSb. However, the present invention is not limited thereto.

A quantum dot may have a full width at half maximum (FWHM) of alight-emitting wavelength spectrum of about 45 nm or less, about 40 nm or less, or about 30 nm or less. In such a range, color purity or gamut may be enhanced. In addition, since light emitted through the quantum dot is emitted in an omni-direction, a light viewing angle may be enhanced.

In addition, the quantum dot has a form generally used in the art to which the present invention belongs, and is not particularly limited. However, in detail, the quantum dot may have a shape such as a sphere, a pyramid, a multi-armed shape or a cubic nanoparticle, a nanotube, a nanowire, a nanofiber, and/or a nanoplate particle.

The quantum dot may adjust a color of emitted light according to a particle size. Accordingly, the quantum dot may have various colors of emitted light such as blue, red, green, etc.

Figure 3G:
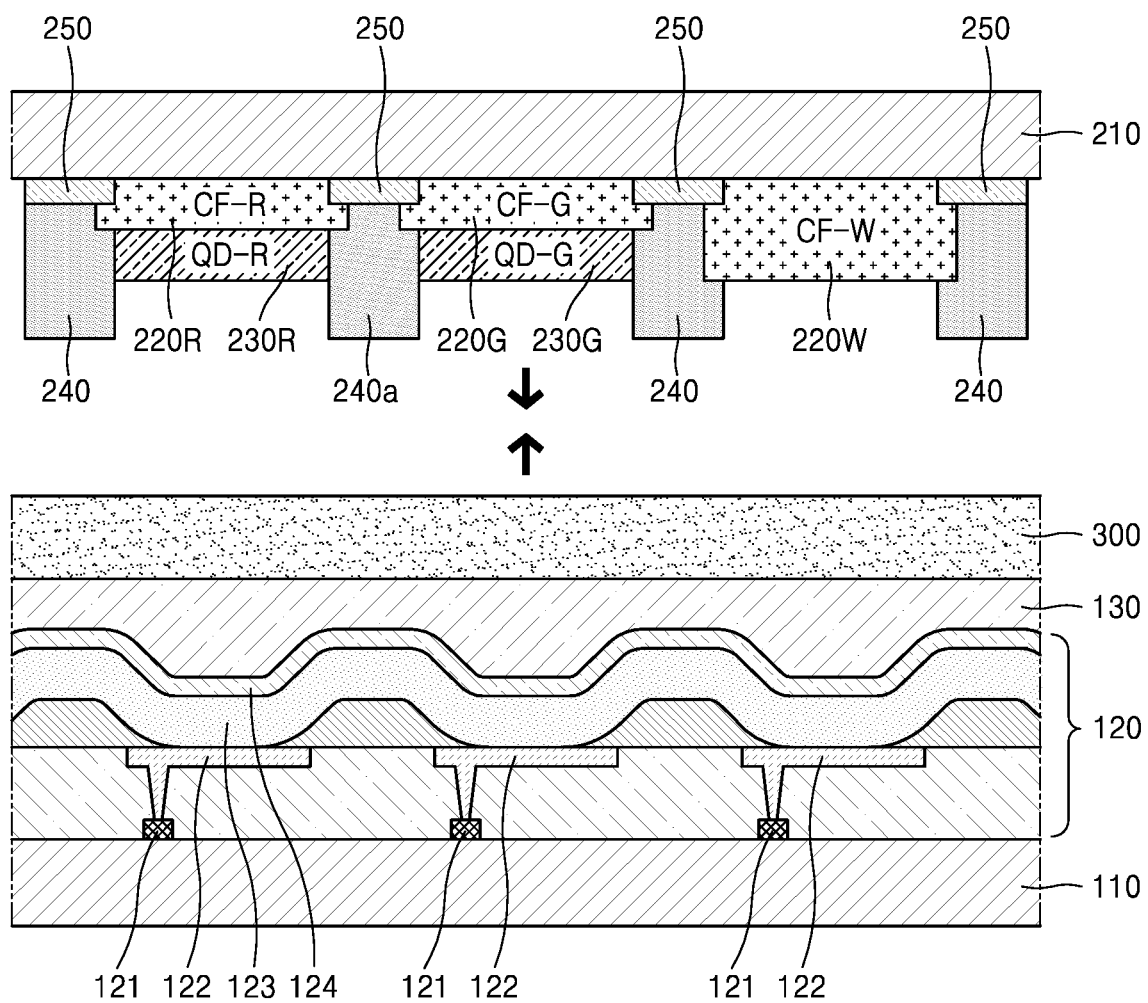

After the quantum-dot thin-film layers 230R and 230G are formed as shown in FIG. 3F, the filler 300 is applied between the first and second substrates 110 and 210, and then, the first substrate 110 is bonded to the second substrate 210, as shown in FIG. 3G. Then, as shown in FIG. 1, the display apparatus including the organic light-emitting diode 120, the quantum-dot thin-film layers 230R and 230G, and the color filter layers 220R, 220G, and 220W is implemented.

In addition, the first and second banks 240 and 240a clearly define a boundary between respective pixels, thus a defect that may be caused by color mixture rarely occurs. Accordingly, the display apparatus having very stable color quality may be implemented.

Figure 4:
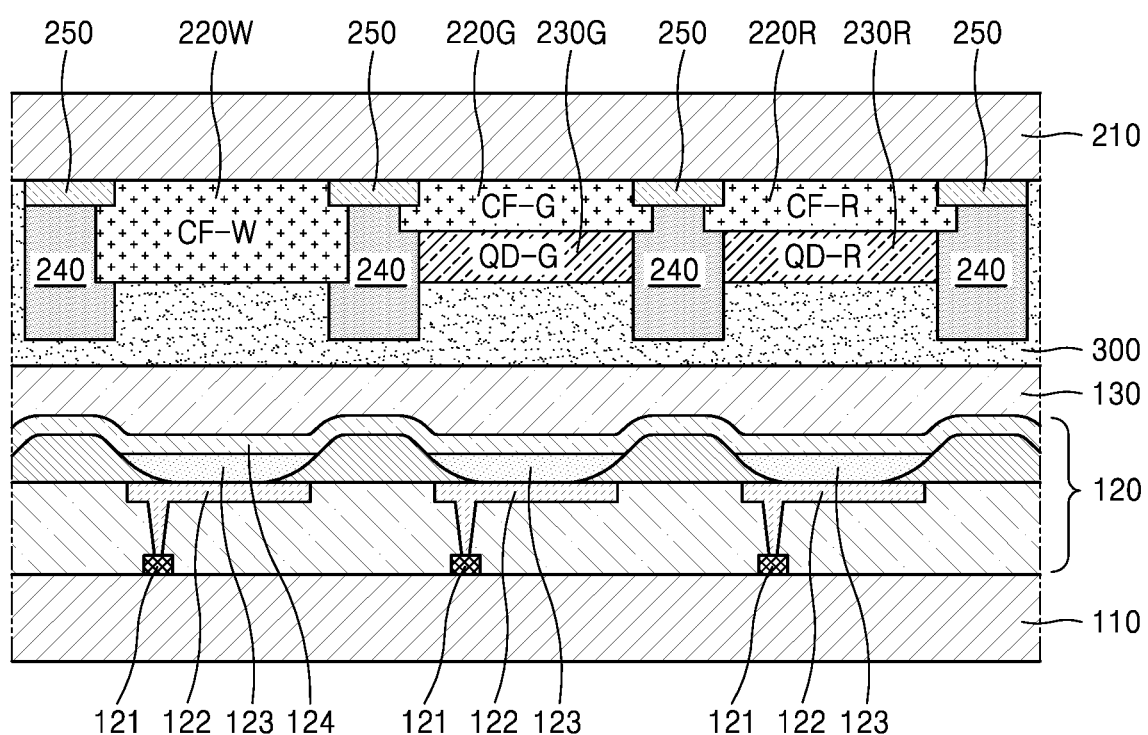
FIG. 4 is a cross-sectional view illustrating a display apparatus according to an exemplary embodiment of the present invention.

According to an exemplary embodiment of the present invention, the organic light-emitting layer 123 of the organic light-emitting diode 120 may be formed as a common layer over a whole pixel area is shown as an example in FIG. 1. As shown in FIG. 4, however, a modified example is illustrated in which the organic light-emitting layer 123 is arranged separately for each pixel. For example, it is shown in FIG. 4 that the organic light-emitting layer 123 may be arranged separately for each pixel and the cathode electrode 124 may be disposed directly on non-light emitting regions between pixels and a surface of the organic light-emitting layer 123. In this case, the first and second banks 240 and 240a may be firmly maintained to prevent color mixture.

As described above according to the display apparatus and a method of manufacturing the same according to exemplary embodiments of the present invention, a bank damaged during a manufacture process may be quickly and efficiently repaired. Thus, an image of clean and clear colors may be implemented by obstructing color mixture that may be caused by damage to the banks. Thus, performance and reliability of a display apparatus may be increased.

While the present invention has been shown and described with reference to exemplary embodiments thereof, it should be understood by those of ordinary skill in the art that various modifications may be made thereto without departing from the spirit and scope of the present invention as defined by the appended claims.

What is claimed is:

1. A display apparatus, comprising:
   a first substrate on which a plurality of organic light-emitting diodes are arranged; and
   a second substrate bonded to the first substrate, wherein the second substrate comprises a plurality of light control units respectively corresponding to the plurality of organic light-emitting diodes and a plurality of banks arranged between the plurality of light control units,
   wherein the plurality of banks comprise:
   a first bank having a deflection arrangement structure in which a fluorine-containing polymer is concentrated on a surface of a side of the first bank; and
   a second bank that does not have a deflection arrangement structure in which the fluorine-containing polymer is deflectively arranged.

2. The display apparatus of claim 1, wherein the fluorine-containing polymer in the first bank is deflectively arranged on the surface of the side of the first bank which is opposite to the second substrate.

3. The display apparatus of claim 1, wherein the fluorine-containing polymer comprises perfluoropolyether (PFPE).

4. The display apparatus of claim 1, wherein the surface of the side on which the fluorine-containing polymer is deflectively arranged is liquid-repellent.

5. The display apparatus of claim 1, wherein
   the second bank is comprised of perfluoropolyether (PFPE), acryl, silicon, and/or epoxy.

6. The display apparatus of claim 1, further comprising a coating layer on a surface of the second bank corresponding to the surface of the side of the first bank.

7. The display apparatus of claim 6, wherein the coating layer comprises a liquid-repellent material.

8. The display apparatus of claim 1, further comprising a thin-film encapsulation layer covering the plurality of organic light-emitting diodes.

9. The display apparatus of claim 1, wherein the plurality of organic light-emitting diodes all generate blue light.

10. The display apparatus of claim 1, wherein the plurality of light control units comprise a quantum-dot thin-film layer configured to change a color of light generated from the plurality of organic light-emitting diodes and/or a color filter layer configured to increase color purity of the light.

11. A method of manufacturing an organic light-emitting display apparatus, comprising:
    forming a plurality of organic light-emitting diodes on a first substrate;
    forming a plurality of color filter layers respectively corresponding to the plurality of organic light-emitting diodes on a second substrate;
    forming a plurality of first banks at positions between the plurality of color filter layers on the second substrate;
    repairing damaged first banks by forming second banks at positions where the first banks are damaged;
    forming a quantum-dot thin-film layer on the plurality of color filter layers; and
    bonding the first substrate to the second substrate.

12. The method of claim 11, wherein the forming of the plurality of first banks comprises coating the second substrate with a composite polymer, wherein the composite polymer includes a fluorine-containing polymer and a non-fluorine-containing polymer; and
    arranging the fluorine-containing polymer on surfaces of the plurality of first banks by heating the composite polymer, and leaving the composite polymer at the positions between the plurality of color filter layers by patterning the composite polymer.

13. The method of claim 12, wherein the fluorine-containing polymer comprises perfluoropolyether (PFPE).

14. The method of claim 12, further comprising forming a liquid-repellent coating layer on a surface of the second bank corresponding to the surfaces of the plurality of first banks.

15. The method of claim 11, wherein the forming of the second bank comprises arranging a mask, in which an opening is formed, on the second substrate, and injecting a material of the second bank in the opening.

16. The method of claim 15, wherein the injecting of the material of the second bank comprises:
    melting the material of the second bank into the opening by irradiating the material of the second bank with a laser beam, or
    extruding the material of the second bank into the opening by pressing the material of the second bank.

17. The method of claim 15, wherein the material of the second bank comprises perfluoropolyether (PFPE), acryl, silicon and/or epoxy.

18. The method of claim 11, wherein the plurality of organic-light emitting diodes generate blue light, and
    wherein the quantum-dot thin-film layer is formed at a position where the color of the blue light is to be changed.

19. The method of claim 11, wherein the quantum-dot thin-film layer changes a color of the light generated by an organic light-emitting diode of the plurality of organic light-emitting diodes, and the plurality of color filter layers increase color purity of the light.

20. The method of claim 11, further comprising a thin-film encapsulation layer covering the plurality of organic light-emitting diodes.

* * * * *